(12) United States Patent
Scholz

(10) Patent No.: US 10,256,602 B2
(45) Date of Patent: Apr. 9, 2019

(54) LASER COMPONENT AND METHOD OF PRODUCING SAME

(71) Applicant: OSRAM Opto Semiconductors GmbH, Regensburg (DE)

(72) Inventor: Dominik Scholz, Regensburg (DE)

(73) Assignee: OSRAM Opto Semiconductors GmbH (DE)

( * ) Notice: Subject to any disclaimer, the term of this patent is extended or adjusted under 35 U.S.C. 154(b) by 0 days.

(21) Appl. No.: 15/516,964

(22) PCT Filed: Oct. 7, 2015

(86) PCT No.: PCT/EP2015/073145
§ 371 (c)(1),
(2) Date: Apr. 5, 2017

(87) PCT Pub. No.: WO2016/055520
PCT Pub. Date: Apr. 14, 2016

(65) Prior Publication Data
US 2017/0310079 A1    Oct. 26, 2017

(30) Foreign Application Priority Data
Oct. 8, 2014  (DE) ......................... 10 2014 114 618

(51) Int. Cl.
*H01S 5/00* (2006.01)
*H01S 5/022* (2006.01)
*H01S 5/024* (2006.01)

(52) U.S. Cl.
CPC ...... *H01S 5/02252* (2013.01); *H01S 5/02292* (2013.01); *H01S 5/02469* (2013.01);
(Continued)

(58) Field of Classification Search
CPC ............. H01S 5/02252; H01S 5/02292; H01S 5/02469; H01S 5/022; H01S 5/02208; H01L 2224/16225
See application file for complete search history.

(56) References Cited

U.S. PATENT DOCUMENTS 4,807,238 A  *  2/1989  Yokomori ............... H01L 33/60
                                                      257/E33.072
5,566,265 A  *  10/1996  Spaeth ................ G02B 6/29361
                                                      385/93
(Continued)

FOREIGN PATENT DOCUMENTS

DE   10 2008 063 634 A1    6/2010
DE   10 2012 205 513 A1    10/2013
(Continued)

OTHER PUBLICATIONS

German Search Report dated May 5, 2015 in corresponding German Patent Application No. 10 2014 114 618.2.
(Continued)

*Primary Examiner* — Jessica S Manno
*Assistant Examiner* — Delma R Fordé
(74) *Attorney, Agent, or Firm* — DLA Piper LLP (US)

(57) ABSTRACT

A laser component has a housing, which includes a carrier having a cavity with a bottom surface and a sidewall, wherein the cavity widens starting from the bottom surface, the side wall is inclined relative to the bottom surface by an angle different from 45°, a laser chip, an emission direction of which is oriented parallel to the bottom surface, is arranged on the bottom surface in the cavity, a reflective element is arranged in the cavity and bears on an edge between the bottom surface and the side wall, a reflective surface of the reflective element defines an angle with the bottom surface of the cavity, and the emission direction
(Continued)

defines an angle of 45° with the reflective surface of the reflective element.

13 Claims, 3 Drawing Sheets

(52) U.S. Cl.
CPC .............. *H01L 2224/16225* (2013.01); *H01L 2924/16195* (2013.01); *H01S 5/02208* (2013.01)

(56) References Cited

U.S. PATENT DOCUMENTS

| | | | |
|---|---|---|---|
| 5,793,785 A | 8/1998 | Nakanishi et al. | |
| 6,459,711 B1 | 10/2002 | Hamaguchi et al. | |
| 6,998,691 B2* | 2/2006 | Baugh ................. | G02B 6/4214 257/432 |
| 8,235,605 B2* | 8/2012 | Kim ..................... | G02B 6/4246 359/629 |
| 8,471,289 B2* | 6/2013 | Okayama ............. | H01L 24/97 257/678 |
| 9,608,731 B2* | 3/2017 | Gudeman ............. | H04B 10/516 |
| 9,741,910 B1* | 8/2017 | Haiberger ............. | H01L 33/56 |
| 2005/0226636 A1* | 10/2005 | Hiramatsu ........... | H01S 5/02228 398/182 |
| 2005/0276546 A1* | 12/2005 | Weigert ............... | G02B 6/4246 385/89 |
| 2006/0072870 A1 | 4/2006 | Lee et al. | |
| 2008/0023713 A1* | 1/2008 | Maeda ................. | H01L 33/486 257/98 |
| 2009/0021744 A1 | 1/2009 | Akanuma et al. | |
| 2010/0002235 A1* | 1/2010 | Willing ............... | G01N 21/3504 356/437 |
| 2010/0226655 A1* | 9/2010 | Kim ..................... | G02B 6/4246 398/139 |
| 2011/0158273 A1 | 6/2011 | Okayama et al. | |
| 2014/0016661 A1* | 1/2014 | Orita ................... | H01L 33/02 372/50.1 |
| 2015/0003482 A1* | 1/2015 | Monadgemi ......... | H01S 5/02292 372/44.01 |
| 2016/0285233 A1* | 9/2016 | Victoria .............. | H01S 5/02276 |
| 2017/0148959 A1* | 5/2017 | Haiberger ........... | H01L 33/56 |
| 2017/0237228 A1* | 8/2017 | Gudeman ............ | B81B 7/0067 372/26 |
| 2017/0263833 A1* | 9/2017 | Chiu .................... | H01L 33/62 |
| 2018/0034236 A1* | 2/2018 | Khrushchev ....... | G02B 27/0972 |

FOREIGN PATENT DOCUMENTS

| | | |
|---|---|---|
| EP | 0 664 585 A1 | 7/1995 |
| EP | 1 544 966 A2 | 6/2005 |
| JP | 06-350187 | 12/1994 |
| JP | 2005-164871 | 6/2005 |
| JP | 2009-19982 | 1/2009 |
| JP | 2012-54527 | 3/2012 |

OTHER PUBLICATIONS

Notice of Reasons for Rejection dated Feb. 6, 2018, of corresponding Japanese Application No. 2017-515232 in English.
First Office Action dated Aug. 28, 2018, of counterpart Chinese Application No. 201580054712.4, in English.

* cited by examiner

LASER COMPONENT AND METHOD OF PRODUCING SAME

TECHNICAL FIELD

This disclosure relates to a laser component and to a method of producing a laser component.

BACKGROUND

Laser components having semiconductor-based laser chips are known. In such laser components, the laser chip is arranged in a housing used to encapsulate the laser chip in a hermetically sealed fashion to prevent excessive aging of a laser facet of the laser chip. The housing is furthermore used to dissipate waste heat from the laser chip.

SUMMARY

I provide a laser component having a housing, which includes a carrier having a cavity with a bottom surface and a side wall, wherein the cavity widens starting from the bottom surface, the side wall is inclined relative to the bottom surface by an angle different from 45°, a laser chip, an emission direction of which is oriented parallel to the bottom surface, is arranged on the bottom surface in the cavity, a reflective element is arranged in the cavity and bears on the edge between the bottom surface and the side wall, a reflective surface of the reflective element defines an angle of 45° with the bottom surface of the cavity, and the emission direction defines an angle of 45° with the reflective surface of the reflective element.

I also provide a method of producing a laser component including providing a carrier having a cavity with a bottom surface and a side wall, the cavity widening starting from the bottom surface, wherein the side wall in inclined relative to the bottom surface by an angle different from 45°, arranging a laser chip on the bottom surface in the cavity such that an emission direction of the laser chip is oriented parallel to the bottom surface, and arranging a reflective element in the cavity such that the reflective element bears on an edge between the bottom surface and the side wall, a reflective surface of the reflective element defines an angle of 45° with the bottom surface of the cavity, and the emission direction defines an angle of 45° with the reflective surface of the reflective element.

Figure 1:
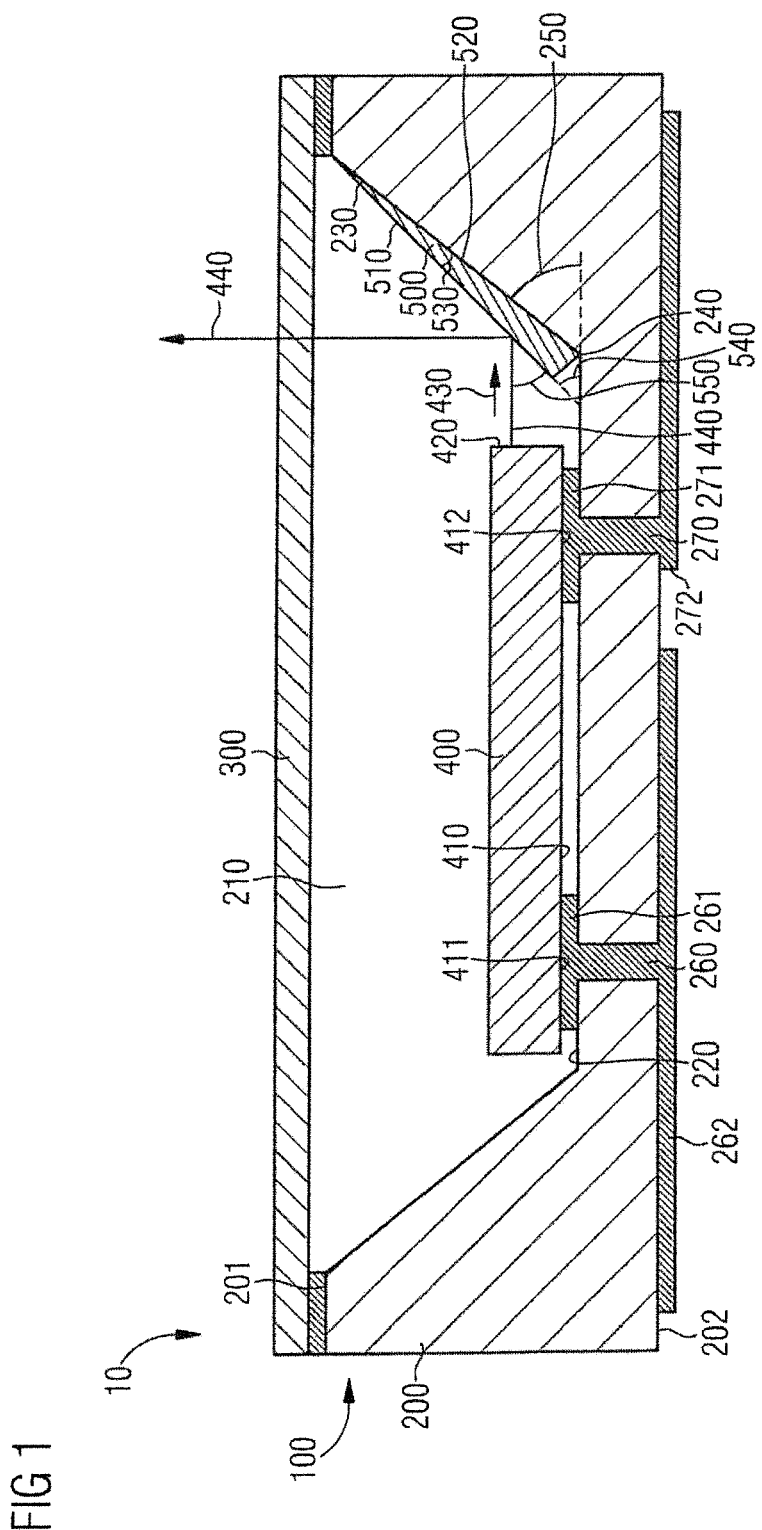
FIG. 1 shows a schematic sectional side view of a first laser component.

LIST OF REFERENCES 10 first laser component
20 second laser component
30 third laser component
100 housing
200 carrier
201 upper side
202 lower side
210 cavity
220 bottom surface
230 side wall
240 edge
250 angle
260 first through-contact
261 first contact element
262 first solder contact surface
270 second through-contact
271 second contact element
272 second solder contact surface
300 cover
400 laser chip
410 lower side
411 first contact surface
412 second contact surface
420 laser facet
430 emission direction
440 laser beam
500 first reflective element
510 reflective surface
520 bearing surface
530 angle
540 angle
550 angle
600 second reflective element
610 reflective surface
620 bearing surface
640 angle
650 angle
700 third reflective element
710 reflective surface
720 first bearing surface
730 second bearing surface
740 angle
750 angle

DETAILED DESCRIPTION

I provide a laser component having a housing, which comprises a carrier having a cavity with a bottom surface and a side wall. The cavity widens starting from the bottom surface. A laser chip, the emission direction of which is oriented parallel to the bottom surface, is arranged on the bottom surface in the cavity. A reflective element that bears on an edge between the bottom surface and the side wall is arranged in the cavity. A reflective surface of the reflective element makes an angle of 45° with the bottom surface of the cavity. The emission direction likewise makes an angle of 45° with the reflective surface of the reflective element.

Owing to this arrangement of the reflective surface of the reflective element, a laser beam emitted by the laser chip can be reflected on the reflective surface of the reflective element into a direction perpendicular to the bottom surface of the cavity. The laser beam reflected on the reflective element can therefore emerge from the cavity of the carrier of the laser component and be emitted by the laser component. Further beam deviation of the laser beam is advantageously not necessary.

Owing to the bearing of the reflective element on the edge between the bottom surface and the side wall of the cavity, a position and orientation of the reflective element in the cavity of the carrier of the housing of the laser component is advantageously established with high accuracy, without additional adjustment steps being necessary during mounting of the reflective element. This allows simple and economical production of the laser component.

Owing to the bearing of the reflective element on the edge between the bottom surface and the side wall of the cavity, a space-saving arrangement of the reflective element is furthermore advantageously obtained, which makes it possible to configure the housing of the laser component with compact external dimensions.

The arrangement of the laser chip with an emission direction parallel to the bottom surface of the cavity advantageously makes it possible to arrange the laser chip in contact with the bottom surface of the cavity over a large area so that a highly thermally conductive connection between the carrier of the housing of the laser component and the laser chip is advantageously obtained. This allows an effective dissipation of waste heat produced in the laser chip during operation of the laser component.

The reflective element may bear on the side wall. Advantageously, this leads to a particularly space-saving arrangement of the reflective element in the cavity of the carrier of the laser component so that the housing of the laser component can have compact external dimensions.

The reflective element may bear on the bottom surface of the cavity. Advantageously, this also leads to a space-saving and stable arrangement of the reflective element in the cavity of the carrier of the housing.

The cavity may be closed by a cover. Since no beam deviation of the laser beam emitted by the laser chip of the laser component needs to take place on the cover of the housing of the laser component, the cover can advantageously be configured simply and economically. Since the cover does not need to have any beam deviating structures, special adjustment of the cover is also not required during mounting of the laser component so that production of the laser component is simplified.

The reflective element may comprise a glass. Advantageously, the reflective surface of the reflective element can therefore have a particularly high reflectivity.

The reflective element may be configured as a prism. This allows simple and economical production of the reflective element, as well as simple and economical mounting of the reflective element in the cavity of the carrier of the housing of the laser component.

The side wall of the cavity may be inclined relative to the bottom surface of the cavity by an angle different from 45°. The deviation of the angle between the side wall and the bottom surface of 45° is advantageously compensated for by the reflective element.

The carrier may comprise an at least partially crystalline semiconductor material. Advantageously, this allows simple and economical production of the carrier using the methods of semiconductor technology.

In the laser component, the carrier may comprise silicon. In this case, the bottom surface is formed by a {100} plane of the carrier. The side wall is formed by a {111} plane of the carrier. Advantageously, this makes it possible to produce the cavity of the carrier by an etching method. In this case, the side wall and the bottom surface may be formed by different etching rates in different crystal directions of the carrier, a defined angle between the side wall and the bottom surface of the cavity being obtained.

A method of producing a laser component comprises steps of providing a carrier having a cavity with a bottom surface and a side wall, the cavity widening starting from the bottom surface, of arranging a laser chip on the bottom surface in the cavity such that an emission direction of the laser chip is oriented parallel to the bottom surface, and arranging a reflective element in the cavity such that the reflective element bears on an edge between the bottom surface and the side wall, a reflective surface of the reflective element makes an angle of 45° with the bottom surface of the cavity, and the emission direction likewise makes an angle of 45° with the reflective surface of the reflective element.

Advantageously, the position and orientation of the reflective element in the cavity are established with high accuracy in this method by arrangement of the reflective element bearing on the edge between the bottom surface and the side wall of the cavity, without a separate adjustment step being necessary therefor. The method can therefore advantageously be carried out simply and economically.

In the method, the carrier may be inclined during the arrangement of the reflective element such that the edge is arranged between the bottom surface and the side wall, below the bottom surface and below the side wall. The reflective element is therefore automatically brought to bear and/or kept bearing on the edge between the bottom surface and the side wall of the cavity during arrangement of the reflective element in the cavity of the carrier by the force of gravity so that carrying out the method is advantageously simplified even further.

Provision of the carrier may comprise creating the cavity by an etching process. Advantageously, this allows simple and economical provision of the carrier. In particular, creating the cavity in the carrier may be carried out by established methods of semiconductor technology.

The reflective element may be fastened in the cavity by a solder connection or an adhesive bond. Advantageously, this allows simple, robust and economical fastening of the reflective element in the cavity.

The method may comprise a further step of sealing the cavity by a cover. The cover may, for example, be fastened on the carrier of the housing element of the laser component by a wafer bonding method. Since, in the laser component that can be obtained by the method, no beam deviation has to take place on the cover of the housing of the laser component, special adjustment of the cover is advantageously not necessary. The method can therefore be carried out simply, rapidly and economically.

The carrier may be provided with a plurality of cavities, each of which has a bottom surface and a side wall. In this case, a laser chip is respectively arranged in each cavity such that an emission direction of the laser chip is oriented parallel to the bottom surface of the cavity. A reflective element is arranged in each cavity such that the reflective element bears on an edge between the bottom surface and the side wall of the cavity, a reflective surface of the reflective element makes an angle of 45° with the bottom surface of the cavity, and the emission direction likewise makes an angle of 45° with the reflective surface of the reflective element. Advantageously, the method therefore allows parallel production of a multiplicity of laser components in common processing steps. The production costs per individual laser component can therefore advantageously be reduced significantly. Furthermore, the processing time required per laser component produced can therefore advantageously be reduced significantly.

The above-described properties, features and advantages, as well as the way in which they are achieved, will become more clearly and readily comprehensible in conjunction with the following description of examples, which will be explained in more detail in connection with the drawings.

FIG. 1 shows a schematic sectional side view of a first laser component 10. The first laser component 10 comprises a housing 100, in which a semiconductor-based laser chip 400 is arranged.

The housing 100 of the first laser component 10 comprises a carrier 200. The carrier 200 is produced from a carrier substrate, preferably from a crystalline or semicrystalline semiconductor substrate. For example, the carrier 200 may be produced from a semiconductor wafer, for example, from a silicon wafer, in particular, for example, from a {100} silicon wafer.

The carrier 200 has an upper side 201 and a lower side 202 lying opposite the upper side 201. A cavity 210 is configured on the upper side 201 of the carrier 200. The cavity 210 extends into the carrier 200 from the upper side 201 in the direction of the lower side 202. The cavity 210 has a bottom surface 220 oriented essentially parallel to the upper side 201 and to the lower side 202 of the carrier 200. The cavity 210 has an opening on the upper side 201 of the carrier 200 and is closed in the region of the bottom surface 220.

A side wall 230 extends from the bottom surface 220 of the cavity 210 to the upper side 201 of the carrier 200. An edge 240 is configured between the bottom surface 220 and the side wall 230. The side wall 230 is inclined relative to the bottom surface 220 by an angle 250 that lies between 0° and 90°, and may in particular have a value different from 45°. Owing to the inclination of the side wall 230, the cavity 210 widens starting from the bottom surface 220 in the direction of the upper side 201 of the carrier 200, i.e., in the direction of the opening of the cavity 210.

The cavity 210 may, for example, be applied by an etching method on the upper side 201 of the carrier 200. If the carrier 200 comprises a crystalline or semicrystalline semiconductor material, then an anisotropy of an etching rate may in this case be used to configure the bottom surface 220 and the side wall 230, inclined by the angle 250 relative to the bottom surface 220, of the cavity 210. If the carrier 200 is a silicon wafer whose upper side 201 is formed by a {100} plane, then the bottom surface 220 may be likewise formed by a {100} plane and the side wall 230 may be formed by a {111} plane of the carrier 200. In this case, the angle 250 between the side wall 230 and the bottom surface 220 of the cavity 210 is, for instance, 54.74°. The bottom surface 220 and/or the side wall 230 of the cavity 210 may, however, also be formed by other crystal planes. The carrier 200 may also consist of a material other than silicon. The cavity 210 may also be configured by a method other than an etching method.

The carrier 200 of the first laser component 10 has a first through-contact 260 and a second through-contact 270. The through-contacts 260, 270 respectively extend from the bottom surface 220 of the cavity 210 to the lower side 202 of the carrier 200. A first contact element 261 and a second contact element 271 are arranged on the bottom surface 220 of the cavity 210. A first solder contact surface 262 and a second solder contact surface 272 are arranged on the lower side 202 of the carrier 200. The first contact element 261 electrically conductively connects to the first solder contact surface 262 by the first through-contact 260. The second contact element 271 electrically conductively connects to the second solder contact surface 272 by the second through-contact 270. The contact elements 261, 271 and the solder contact surfaces 262, 272 may, for example, be configured as planar metallizations. The through-contacts 260, 270 may, for example, be configured as openings arranged in the carrier 200 that are filled with an electrically conductive material.

The first solder contact surface 262 and the second solder contact surface 272 on the lower side 202 of the carrier 200 may be used for electrical contacting of the first laser component 10. The first laser component 10 may, for example, be provided as an SMT component for surface mounting, for example, surface mounting by reflow soldering.

The laser chip 400 is arranged in the cavity 210 of the carrier 200 on the bottom surface 220 of the cavity 210. In this case, a lower side 410 of the laser chip 400 faces toward the bottom surface 220. A first contact surface 411 and a second contact surface 412 of the laser chip 400 electrically conductively connects to the first contact element 261 and the second contact element 271 on the bottom surface 220 of the cavity 210 of the carrier 200. In the example shown in FIG. 1, the contact surfaces 411, 412 of the laser chip 400 are arranged on the lower side 410 of the laser chip 400 and connect to the contact elements 261, 271 on the bottom surface 220 of the cavity 210, for example, by solder connections. The contact surfaces 411, 412 may, however, also be arranged at other positions of the laser chip 400 and/or connect to the contact elements 261, 271 of the carrier 200 in another way, for example, by bond connections.

Besides the first through-contact 260 and the second through-contact 270, the carrier 200 of the first laser component 10 may also have further through-contacts intended to dissipate waste heat from the laser chip 400 and transport it to the lower side 202 of the carrier 200 of the housing 100. These further through-contacts may connect to further contact elements on the bottom surface 220 of the cavity 210 used to establish highly thermally conductive connections to the laser chip 400. Furthermore, the further through-contacts may connect to further solder contact surfaces on the lower side 202 of the carrier 200 used to conduct waste heat out of the first laser component 10.

The laser chip 400 has a laser facet 420 oriented perpendicularly to the lower side 410 of the laser chip 400. The laser chip 400 is configured to emit a laser beam 440 on its laser facet 420 in an emission direction 430 oriented perpendicularly to the laser facet 420. The emission direction 430 therefore extends essentially parallel to the lower side 410 of the laser chip 400, and therefore also essentially parallel to the bottom surface 220 of the cavity 210 of the carrier 200. The emission direction 430 of the laser chip 400 is oriented in the direction of the side wall 230 of the cavity 210.

The laser beam 440 emitted by the laser chip 400 is intended to be emitted by the first laser component 10 in a direction perpendicular to the upper side 201 of the carrier 200. To this end, the laser beam 440 emitted by the laser chip 400 must be deviated by 90°. To this end, the first laser component 10 has a first reflective element 500.

The first reflective element 500 has the geometrical shape of a prism with a triangular base surface, preferably the geometrical shape of a cylinder. The first reflective element 500 is therefore configured in the shape of a wedge. The first reflective element 500 may, for example, consist of glass.

The first reflective element 500 has a reflective surface 510 and a bearing surface 520. The reflective surface 510 and the bearing surface 520 make an angle 530. The angle 530 between the reflective surface 510 and the bearing surface 520 of the first reflective element 500 is dimensioned such that the difference between the angle 250, by which the side wall 230 of the cavity 210 is inclined relative to the bottom surface 220 of the cavity 210, and the angle 530 between the reflective surface 510 and the bearing surface 520 of the first reflective element 500 has a value of 45°. If the angle 250, by which the side wall 230 is inclined relative to the bottom surface 220 of the cavity 210 is 54.74°, for example, then the angle 530 between the reflective surface 510 and the bearing surface 520 of the first reflective element 500 has a value of 9.74°.

The first reflective element 500 is arranged in the cavity 210 of the carrier 200. The bearing surface 520 of the first reflective element 500 in this case bears on the side wall 230 of the cavity 210. At the same time, the first reflective element 500 also bears on the edge 240 between the bottom surface 220 and the side wall 230 of the cavity 210. This ensures an established position and orientation of the first reflective element 500 in the cavity 210 of the carrier 200. The reflective surface 510 of the first reflective element 500 is oriented toward the laser facet 420 of the laser chip 400 arranged in the cavity 210.

As a result of the described arrangement of the first reflective element 500, the reflective surface 510 of the first reflective element 500 is inclined relative to the bottom surface 220 of the cavity 210 by an angle 540 of 45°. Furthermore, the emission direction 430 of the laser chip 400 makes an angle 550 of likewise 45° with the reflective surface 510 of the first reflective element 500. The orientation of the first reflective element 500 in the cavity 210 of the carrier 200 may also be expressed in that there is a plane oriented perpendicularly to the bottom surface 220 of the cavity 210, perpendicularly to the laser facet 420 of the laser chip 400 and perpendicularly to the reflective surface 510 of the first reflective element 500. There may naturally be certain tolerances and deviations, depending on the production accuracy.

During operation of the first laser component 10, the laser beam 440 emitted by the laser chip 400 on its laser facet 420 in the emission direction 430 strikes the reflective surface 510 of the first reflective element 500 at the angle 550 of 45°, and is therefore deviated in a direction perpendicular to the emission direction 430, i.e., also in a direction perpendicular to the bottom surface 220 of the cavity 210 of the carrier 200. The laser beam 440 deviated in this way emerges from the cavity 210 of the carrier 200 at the upper side 210 of the carrier 200, and is therefore emitted by the first laser component 10.

The cavity 210 of the carrier 200 may be closed by a cover 300 on the upper side 210 of the carrier 200. Preferably, the cavity 210 is hermetically tightly sealed by the cover 300 to avoid excessive aging of the laser facet 420 of the laser chip 400 during operation of the first laser component 10. The cover 300 comprises an optically transparent material, for example, a glass. The cover 300 may, for example, be configured as a plane-parallel plate. The laser beam 440 reflected on the reflective surface 510 of the first reflective element 500 emerges from the cavity 210 of the carrier 200 through the cover 300, while preferably not being deviated, or being deviated only a little.

To produce the first laser component 10, the cavity 210 is initially applied on the upper side 201 of the carrier 200. Subsequently, the prefabricated first reflective element 500 is arranged in the cavity 210, and fastened on the side wall 230 of the cavity 210 such that the first reflective element 500 bears on the edge 240 between the bottom surface 220 and the side wall 230 of the cavity 210. The fastening of the bearing surface 520 of the first reflective element 500 on the side wall 230 of the cavity 210 may, for example, be carried out by adhesive bonding or soldering.

It is possible to incline the carrier 200 to arrange the first reflective element 500 in the cavity 210 of the carrier 200 such that the edge 240 between the bottom surface 220 and the side wall 230 of the cavity 210 is arranged below the bottom surface 220 and below the side wall 230. The first reflective element 500 therefore slides automatically under the effect of gravity on the side wall 230 of the cavity 210 as far as the edge 240 between the side wall 230 and the bottom surface 220, that ensures that the first reflective element 500 occupies the desired position and orientation in the cavity 210 of the carrier 200.

In a further production step, the laser chip 400 is arranged on the bottom surface 220 of the cavity 210 of the carrier 200. Arrangement of the laser chip 400 in the cavity 210 may also be carried out before arrangement of the first reflective element 500 in the cavity 210 of the carrier 200. A desired position and orientation of the laser chip 400 in the cavity 210 of the carrier 200 may, for example, be adjusted by automatic alignment of the laser chip 400 during production of solder connections between the contact surfaces 411, 412 of the laser chip 400 and the contact elements 261, 271 on the bottom surface 220 of the cavity 210.

The cavity 210 of the carrier 200 may subsequently be closed with the cover 300.

It is possible to configure a plurality of cavities 210 on the upper side 201 of the carrier 200. In this case, the carrier 200 may, for example, be configured as a wafer. Laser chips 400 and first reflective elements 500 may then be arranged in all the cavities 210 of the carrier 200 in the manner described. The carrier 200 may subsequently be divided up to separate the plurality of first laser components 10 produced in this way.

Figure 2:
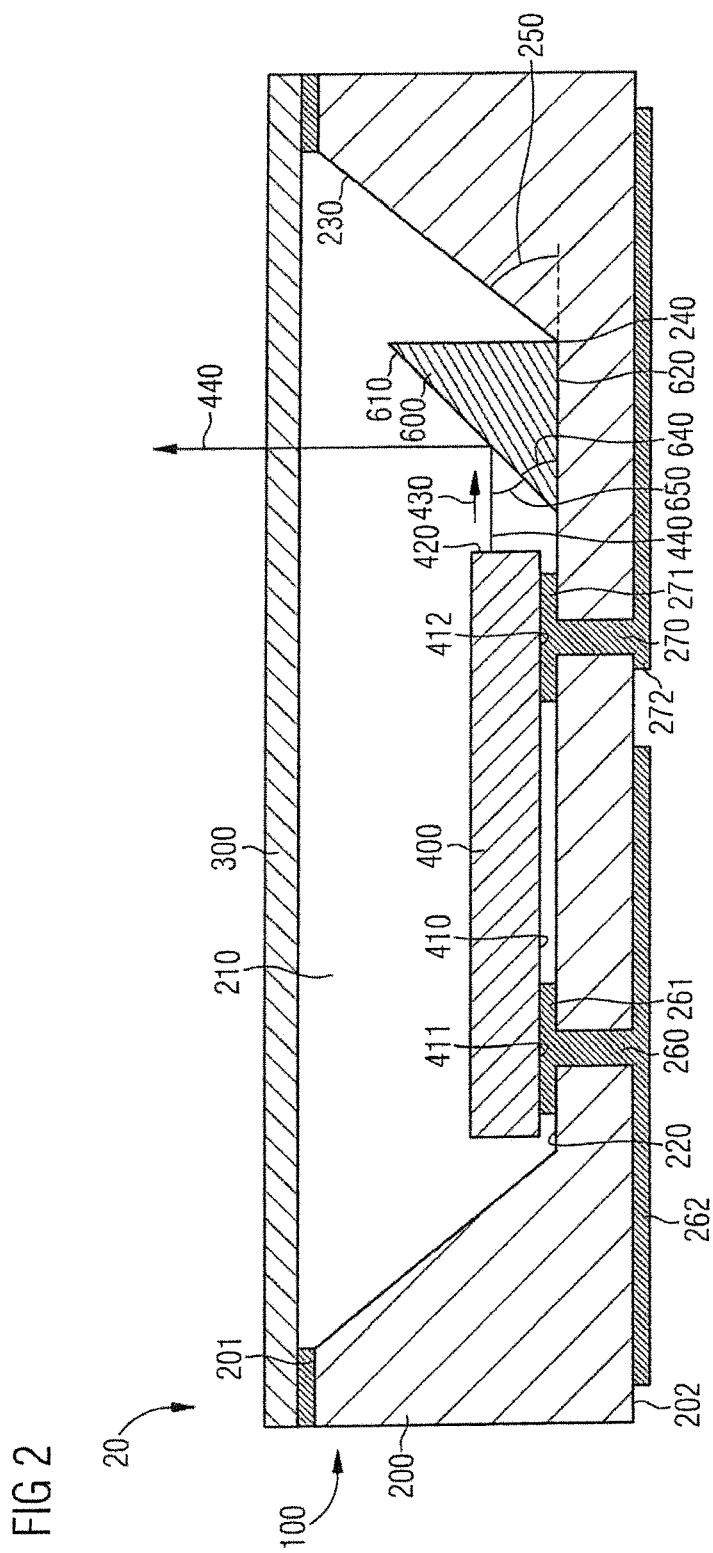
FIG. 2 shows a schematic sectional side view of a second laser component.

FIG. 2 shows a schematic sectional side view of a second laser component 20. The second laser component 20 and the production method used to produce the second laser component 20 has great similarities with the first laser component 10 described with the aid of FIG. 1 and the method of producing the first laser component 10. Constituent parts corresponding to one another are therefore denoted with the same references in the representations in FIGS. 1 and 2. Only the differences between the second laser component 20 and the first laser component 10 will be described below.

Instead of the first reflective element 500, the second laser component 20 has a second reflective element 600. The second reflective element 600 has the geometrical shape of a prism or a cylinder with a triangular base surface. The second reflective element 600 may, for example, also consist of glass.

The second reflective element 600 has a reflective surface 610 and a bearing surface 620. The bearing surface 620 of the second reflective element 600 bears on the bottom surface 220 of the cavity 210 of the carrier 200 of the second laser component 20. In this case, the second reflective element 600 also bears on the edge 240 between the bottom surface 220 and the side wall 230 of the cavity 210 so that the position and orientation of the second reflective element 600 is established.

The reflective surface 610 of the second reflective element 600 faces toward the laser facet 420 of the laser chip 400 of the second laser component 20. The reflective surface 610 of the second reflective element 600 makes an angle 640 of 45° with the bottom surface 220 of the cavity 210 of the carrier 200. The emission direction 430 of the laser chip 400 therefore makes an angle 650, which is likewise 45°, with the reflective surface 610 of the second reflective element 600.

During production of the second laser component 20, the bearing surface 620 of the second reflective element 600 is fastened on the bottom surface 220 of the cavity 210 of the carrier 200, for example, by an adhesive bond or a solder connection. During production of the second laser component 20 as well, the carrier 200 may be inclined to align the second reflective element 600 such that the edge 240 between the bottom surface 220 and the side wall 230 of the cavity 210 is arranged below the bottom surface 220 and below the side wall 230 so that the second reflective element 600 is drawn by the force of gravity in the direction of the edge 240 between the bottom surface 220 and the side wall 230.

Figure 3:
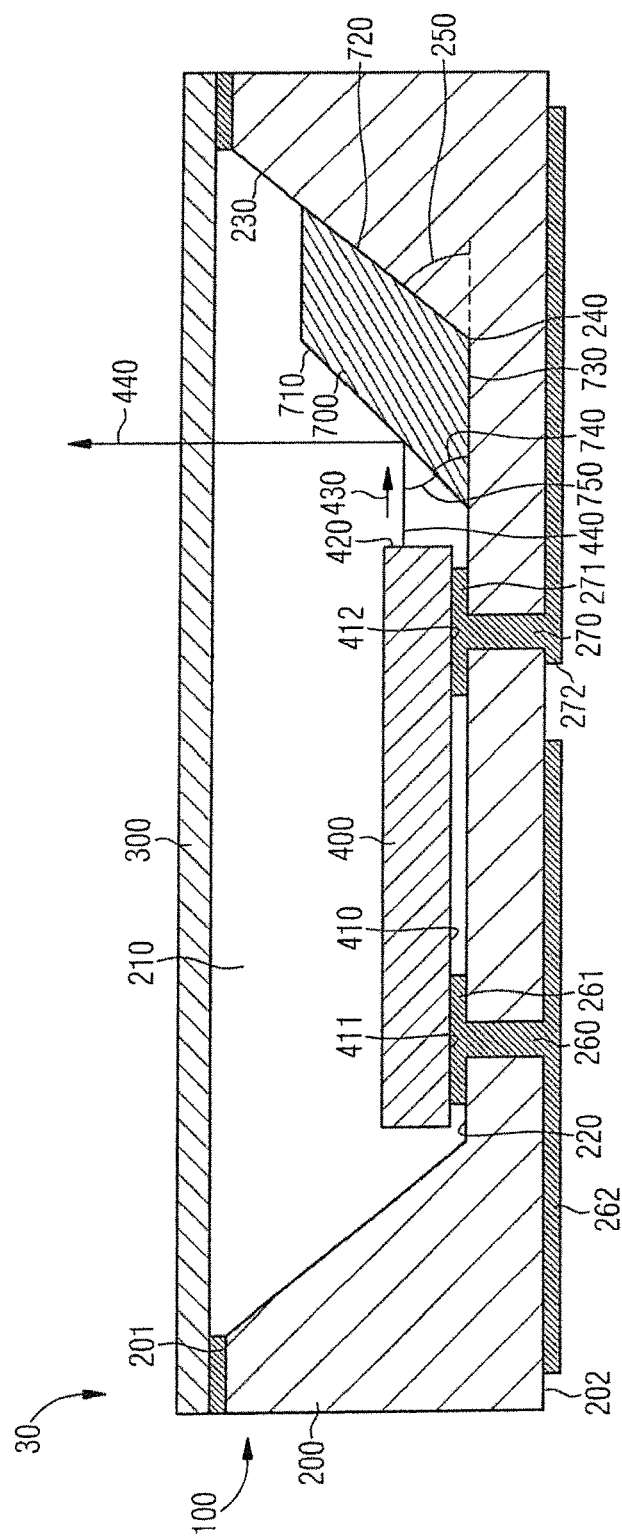
FIG. 3 shows a schematic sectional side view of a third laser component.

FIG. 3 shows a schematic sectional side view of a third laser component 30. The third laser component 30 and the method used to produce the third laser component 30 have great similarity with the first laser component 10 described with the aid of FIG. 1 and the method of producing the first laser component 10. The same references as in FIG. 1 are therefore used for corresponding constituent parts in FIG. 3. Only the differences between the third laser component 30 and the first laser component 10 will be described below.

Instead of the first reflective element 500, the third laser component 30 has a third reflective element 700. The third reflective element 700 has the geometrical shape of a prism with a trapezoidal cross-sectional area, preferably the geometrical shape of a cylinder. The third reflective element 700 may also, for example, consist of glass.

The third reflective element 700 has a reflective surface 710, a first bearing surface 720 and a second bearing surface 730. The first bearing surface 720 of the third reflective element 700 bears on the side wall 230 of the cavity 210 of the carrier 200. The second bearing surface 730 of the third reflective element 700 bears on the bottom surface 220 of the cavity 210 of the carrier 200. The third reflective element 700 also bears on the edge 240 between the bottom surface 220 and the side wall 230 of the cavity 210 to establish the orientation and position of the third reflective element 700 with high accuracy.

The reflective surface 710 of the third reflective element 700 faces toward the laser facet 420 of the laser chip 400. The reflective surface 710 makes an angle 740 of 45° with the bottom surface 220 of the cavity 210 of the carrier 200. The emission direction 430 of the laser chip 400 therefore makes an angle 750, which is likewise 45°, with the reflective surface 710 of the third reflective element 700.

The mounting of the third reflective element 700 in the cavity 210 of the carrier 200 of the third laser component 30 may likewise be carried out with slight tilting of the carrier 200 so that the edge 240 between the bottom surface 220 and the side wall 230 is arranged below the bottom surface 220 and below the side wall 230 of the cavity 210. The force of gravity therefore holds the third reflective element 700 bearing on the bottom surface 220 and the side wall 230 of the cavity 210.

My components and methods have been illustrated and described in more detail with the aid of the preferred examples. This disclosure is not, however, restricted to the examples disclosed. Rather, other variants may be derived therefrom by those skilled in the art without departing from the protective scope of the appended claims.

This application claims priority of DE 10 2014 114 618.2, the subject matter of which is incorporated herein by reference.

The invention claimed is:

1. A laser component having a housing, which comprises a carrier having a cavity with a bottom surface and a side wall,
   wherein the cavity widens starting from the bottom surface,
   the side wall is inclined relative to the bottom surface by an angle different from 45°,
   a laser chip, an emission direction of which is oriented parallel to the bottom surface, is arranged on the bottom surface in the cavity,
   a reflective element is arranged and fastened in the cavity by a solder connection or an adhesive bond and bears on an edge between the bottom surface and the side wall,
   a reflective surface of the reflective element defines an angle of 45° with the bottom surface of the cavity, and
   the emission direction defines an angle of 45° with the reflective surface of the reflective element.

2. The laser component according to claim 1, wherein the reflective element bears on the side wall.

3. The laser component according to claim 1, wherein the reflective element bears on the bottom surface.

4. The laser component according to claim 1, wherein the cavity is closed by a cover.

5. The laser component according to claim 1, wherein the reflective element comprises a glass.

6. The laser component according to claim 1, wherein the reflective element is configured as a prism.

7. The laser component according to claim 1, wherein the carrier comprises an at least partially crystalline semiconductor material.

8. The laser component according to claim 7,
   wherein the carrier comprises silicon,
   the bottom surface is formed by a {100} plane of the carrier, and
   the side wall is formed by a {111} plane of the carrier.

9. A method of producing a laser component comprising:
   providing a carrier having a cavity with a bottom surface and a side wall, the cavity widening starting from the bottom surface, wherein the side wall is inclined relative to the bottom surface by an angle different from 45°;
   arranging a laser chip on the bottom surface in the cavity such that an emission direction of the laser chip is oriented parallel to the bottom surface; and
   arranging a reflective element in the cavity and fastening the reflective element in the cavity by a solder connection or an adhesive bond such that the reflective element bears on an edge between the bottom surface and the side wall, a reflective surface of the reflective element defines an angle of 45° with the bottom surface of the cavity, and the emission direction defines an angle of 45° with the reflective surface of the reflective element.

10. The method according to claim 9, wherein the carrier is inclined during the arrangement of the reflective element such that the edge is arranged between the bottom surface and the side wall, below the bottom surface and below the side wall.

11. The method according to claim 9, wherein etching creates the cavity in the carrier.

12. The method according to claim 9, further comprising sealing the cavity with a cover.

13. The method according to claim 9,
   wherein the carrier is provided with a plurality of cavities, each of which has a bottom surface and a side wall,
   a laser chip is respectively arranged in each cavity such that an emission direction of the laser chip is oriented parallel to the bottom surface of the cavity,
   a reflective element is arranged in each cavity such that the reflective element bears on an edge between the bottom surface and the side wall of the cavity, a reflective surface of the reflective element defines an angle of 45° with the bottom surface of the cavity, and the emission direction defines an angle of 45° with the reflective surface of the reflective element.

\* \* \* \* \*